United States Patent
Katsunuma et al.

(10) Patent No.: US 7,906,967 B2
(45) Date of Patent: Mar. 15, 2011

(54) MAGNETIC RESONANCE IMAGING APPARATUS

(75) Inventors: Ayumi Katsunuma, Otawara (JP); Kiyoshi Yamashita, Otawara (JP)

(73) Assignees: Kaibushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 158 days.

(21) Appl. No.: 12/188,231

(22) Filed: Aug. 8, 2008

(65) Prior Publication Data

US 2009/0039887 A1 Feb. 12, 2009

(30) Foreign Application Priority Data

Aug. 9, 2007 (JP) .................. 2007-208189

(51) Int. Cl.
*G01V 3/00* (2006.01)
(52) U.S. Cl. .......................... 324/318; 324/321
(58) Field of Classification Search .................. 324/318, 324/322, 321

See application file for complete search history.

(56) References Cited

U.S. PATENT DOCUMENTS

| | | | |
|---|---|---|---|
| 5,278,502 A * | 1/1994 | Laskaris et al. ............... 324/318 |
| 5,489,848 A | 2/1996 | Furukawa |
| 6,043,653 A | 3/2000 | Takanori et al. |
| 6,252,404 B1 * | 6/2001 | Purgill et al. .................. 324/318 |
| 6,552,543 B1 * | 4/2003 | Dietz ............................ 324/318 |
| 6,954,068 B1 | 10/2005 | Takanori et al. |
| 7,567,082 B2 * | 7/2009 | Takamori ...................... 324/318 |

FOREIGN PATENT DOCUMENTS

JP 10-118403 5/1998

OTHER PUBLICATIONS

Katsunuma et al., "Quiet MRI with novel acoustic noise reduction", *Magnetic Resonance Materials in Physics, Biology and Medicine*, vol. 13, 2002, pp. 139-144.

* cited by examiner

*Primary Examiner* — Louis M Arana
(74) *Attorney, Agent, or Firm* — Nixon & Vanderhye PC (57) ABSTRACT

An apparatus includes a bore tube inside which an imaging space is formed to place a subject, a static field generating section which is placed outside the tube and generates a static field in the imaging space, a gradient field generating section which is placed between the tube and the static field generating section and generates a gradient field to superimpose on the static field, a cover which is mounted to a side end of the static field generating section and forms a vacuum space in a surrounding of the gradient field generating section together with the tube and the static field generating section, wherein the cover is fixed by fixation parts thereof to the static field generating section and a load of an air pressure to be applied on the cover at a different part from the fixation part is received by the static field generating section.

24 Claims, 6 Drawing Sheets

MAGNETIC RESONANCE IMAGING APPARATUS

CROSS-REFERENCE TO RELATED APPLICATIONS

This application is based upon and claims the benefit of priority from prior Japanese Patent Applications No. 2007-208189, filed Aug. 9, 2007, the entire contents of which are incorporated herein by reference.

BACKGROUND OF THE INVENTION

1. Field of the Invention

The present invention relates to a magnetic resonance imaging apparatus which can help silence operation noise by enclosing noise sources associated with its gradient magnetic field coil.

2. Description of the Related Art

There has been known a magnetic resonance imaging apparatus in which vacuum is created around the gradient coil in order to reduce the noise caused by the vibration of the gradient coil for silencing the apparatus, as discussed in Jpn. Pat. Appln. KOKAI Publication No. 10-118043.

The magnetic resonance imaging apparatus disclosed in Jpn. Pat. Appln. KOKAI Publication No. 10-118043 has such a structure that spaces created between cylindrical bore tubes and static field magnets are encapsulated by sealing covers fixed to side ends of the bore tubes and side ends of the static field magnets.

With the above-described conventional structure, the air pressure applied to the sealing covers is received by the static field magnets and the bore tubes. Therefore, the bore tubes and the sealing cover are tightly coupled, thus making it difficult to achieve an anti-vibration structure. Further, with this structure, the air pressure acts as a buckling force on the bore tubes. Therefore, it is necessary to increase the rigidity of the bore tubes and therefore it is difficult to reduce the thickness of the bore tubes.

BRIEF SUMMARY OF THE INVENTION

Under these circumstances, there has been a demand of lightening the load on the bore tubes via the sealing covers created by the air pressure.

According to a first aspect of the present invention, there is provided a magnetic resonance imaging apparatus comprising: a bore tube inside which an imaging space is formed to place a subject; a static field generating section which is placed outside the bore tube and generates a static field in the imaging space; a gradient field generating section which is placed between the bore tube and the static field generating section and generates a gradient field to superimpose on the static field; at least one sealing cover which is mounted to at least one of side ends of the static field generating section and which forms a vacuum space in a surrounding of the gradient field generating section together with the bore tube and the static field generating section, wherein the sealing cover is fixed by fixation part thereof to the static field generating section and a load of air pressure to be applied on the sealing cover at a different part from the fixation part is received by the static field generating section.

According to a second aspect of the present invention, there is provided a magnetic resonance imaging apparatus comprising: a hollow bore tube inside which an imaging space is formed to place a subject; a hollow static field generating section which is placed outside the bore tube and generates a static field in the imaging space; a hollow gradient field generating section which is placed between the bore tube and the static field generating section and generates a gradient field to superimpose on the static field; and at least one sealing cover including a cover portion which covers an opening between the static field generating section and the bore tube at a position distant from an end surface of the static field generating section, a fixation section fixed to the static field generating section and a bump section which is located distant from the fixation section and bumps against the end surface of the static field generating section, the sealing cover being mounted to at least one of side ends of the static field generating section and forming a sealed space in a surrounding of the gradient field generating section together with the bore tube and the static field generating section According to a third aspect of the present invention, there is provided a magnetic resonance imaging apparatus comprising: a bore tube inside which an imaging space is formed to place a subject; a static field generating section which is placed outside the bore tube and generates a static field in the imaging space; a gradient field generating section which is placed between the bore tube and the static field generating section and generates a gradient field to superimpose on the static field; at least one sealing cover which is mounted to at least one of side end of the static field generating section and forms a sealed space in a surrounding of the gradient field generating section together with the bore tube and the static field generating section; and at least one sealing part which is placed to be brought into contact with an outer side surface of the bore tube in a vicinity of at least one of both end sides of the bore tube, and hermetically sealing a gap between the bore tube and the sealing cover.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described with reference to accompanying drawings.

Figure 1:
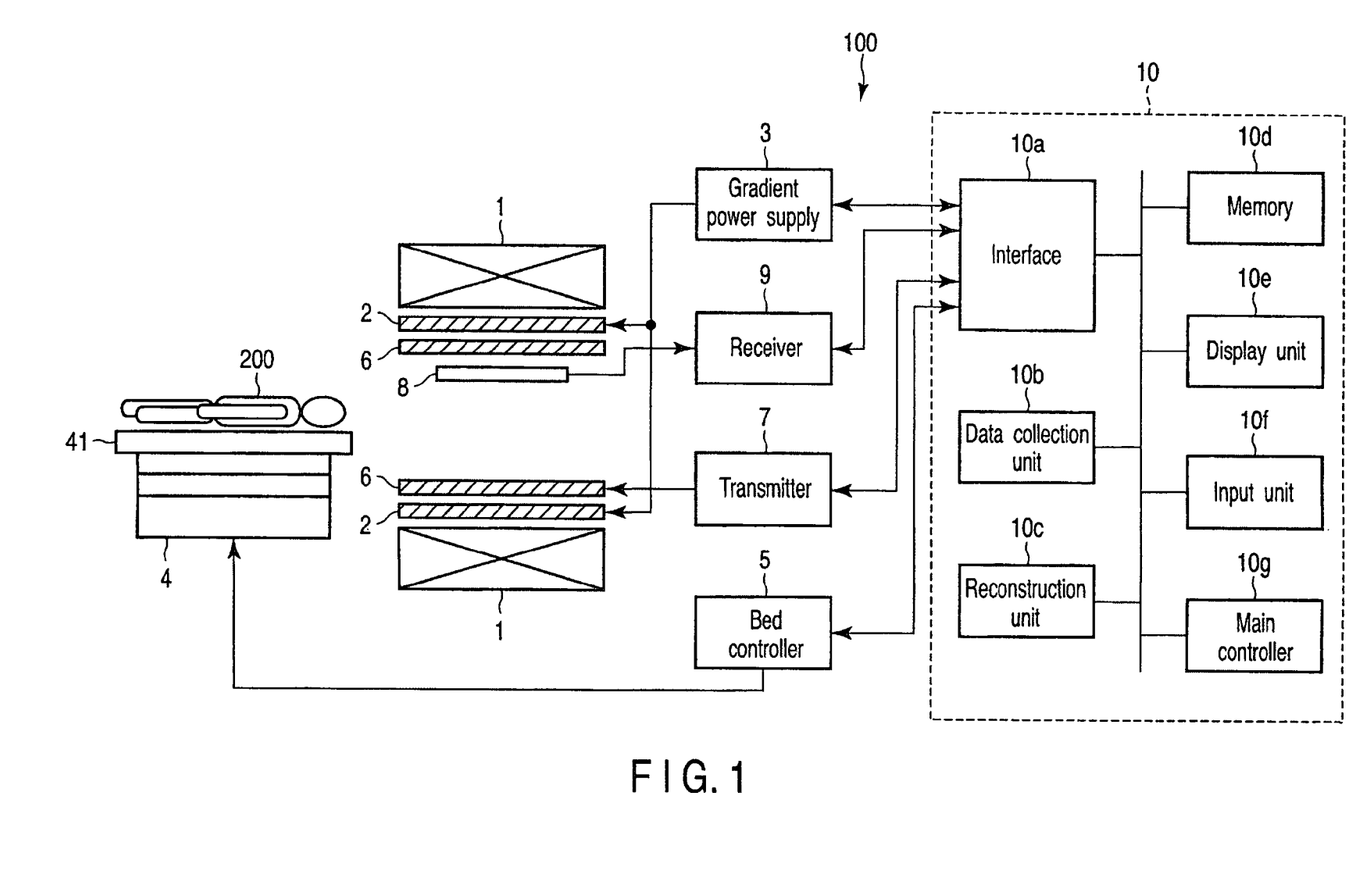
FIG. 1 is a diagram showing the basic structure of a magnetic resonance imaging apparatus according to the present invention throughout embodiments thereof.

FIG. 1 is a diagram showing the basic structure of a magnetic resonance imaging (MRI) apparatus 100 throughout the embodiments of the present invention. As shown in FIG. 1, the MRI apparatus 100 includes a static field magnet 1, a gradient coil 2, a gradient power supply 3, a bed 4, a bed controller 5, a transmission RF coil 6, a transmitter 7, a receiving RF coil 8, a receiver 9 and a computer system 10.

The static field magnet 1 is formed in the shape of a hollow cylinder and adapted to generate a uniform static magnetic field within its inside space. As the static field magnet 1 use is made of a permanent magnet, a superconducting magnet, or the like.

The gradient coil 2 is formed in the shape of a hollow cylinder and placed inside the static field magnet 1. The gradient coil 2 is a combination of three coils each corresponding to a respective one of the three mutually orthogonal X, Y and Z axes. When the three coils are individually supplied with current from the gradient power supply 3, the gradient coil 2 generates gradient magnetic fields, each of which has its strength varied along a corresponding one of the X, Y and Z axes. Suppose that the Z-axis direction coincides with the direction of the static magnetic field. The gradient magnetic fields in the X, Y and Z-axis directions are used as a slice selecting gradient field Gs, a phase encoding gradient magnetic field Ge, and a readout gradient magnetic field Gr, respectively. The slice selecting gradient magnetic field Gs is used to arbitrarily determine an imaging plane section. The phase encoding gradient magnetic field Ge is used to change the phase of magnetic resonance signals according to spatial location. The readout gradient magnetic field Gr is used to change the frequency of the magnetic resonance signals according to spatial location. The gradient coil 2 may be of a non-shielded type or a shielded type, but the shielded type is preferable. A gradient coil of the shielded type includes a shielded coil in addition to the above-described structure, and it is also called "active shielded gradient coil" (ASGC). It should be noted that the shielded coil is driven to generate a magnetic field to cancel out portions of a magnetic field generated from the main coil, which leak into regions other than the predetermined area. Further, the longitudinal dimension of the gradient coil 2 is shorter than that of the static field magnets 1.

A subject 200 under examination is laid down on a top board 41 of the bed 4 and moved into the cavity (imaging space) of the gradient coil 2. The too board 41 of the bed 4 is driven by the bed controller 5 to move in its lengthwise direction and in an up-and-down direction. Usually, the bed 4 is installed so that its lengthwise direction is parallel to the central axis of the static field magnet 1.

The transmitting RF coil 6 is placed inside the gradient coil 2 and generates a radio-frequency magnetic field in response to application thereto of a radio-frequency pulse from the transmitter 7.

The transmitter 7 transmits radio-frequency pulses corresponding to Larmor frequency to the transmitting RF coil 6.

The receiving RF coil 8 is placed inside the gradient coil 2 and adapted to receive magnetic resonance signals emitted from the human body under examination subjected to the radio-frequency magnetic field. The output signal from the receiving RF coil 8 is applied to the receiver 9.

The receiver 9 produces magnetic resonance signal data on the basis of the output signal of the receiving RF coil 8.

The computer system 10 includes an interface unit 10a, a data collection unit 10b, a reconstruction unit 10c, a memory unit 10d, a display unit 10e, an input unit 10f, and a main controller 10g.

The interface unit 10a is connected to the gradient power supply 3, the bed controller 5, the transmitter 7, the receiving RF coil 8, and the receiver 9 and allows signals to be transferred between each of these components and the computer system 10.

The data collection unit 10b collects via the interface unit 10a digital signals output from the receiver 9 and then stores the collected digital signals, i.e., the magnetic resonance signal data, into the memory unit 10d.

The reconstruction unit 10c performs postprocessing, i.e., reconstruction, such as Fourier transforms, on the magnetic resonance signal data stored in the storage unit 10d to obtain spectrum data of desired nuclear spins within the subject 200 or image data.

The memory unit 10d stores magnetic resonance signal data and spectrum data or image data for each subject.

The display unit 10e displays a variety of information, such as spectrum data, image data, etc., under the control of the main controller 10g. As the display unit 10e there is available a display device, such as a liquid crystal display.

The input unit 10f receives a variety of commands and information inputs from an operator. As the input unit 10f there is available a pointing device such as a mouse or trackball a selection device such as a mode changeover switch, or an input device such as a keyboard in accordance with the occasion.

The main controller 10g is equipped with a CPU, a memory, etc., which are not shown in the diagram and collectively controls each component of the MRI apparatus 100. The main controller 10g has a variety of controlling functions to realize the conventionally functions in the MRI apparatus 100.

First Embodiment

Figure 2:
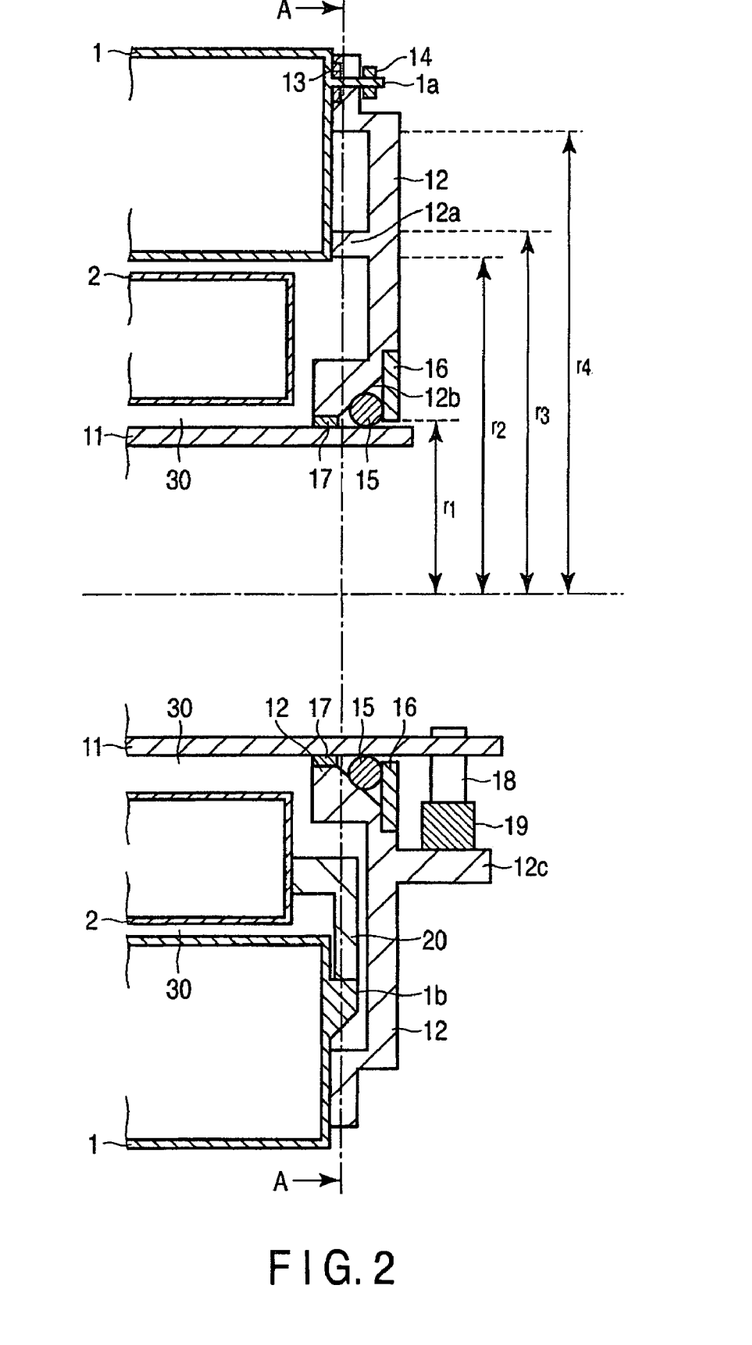
FIG. 2 is a diagram showing a cross section of the structure of the first embodiment in a vicinity of the side ends of the static field magnet and the gradient coil shown in FIG. 1.
Figure 3:
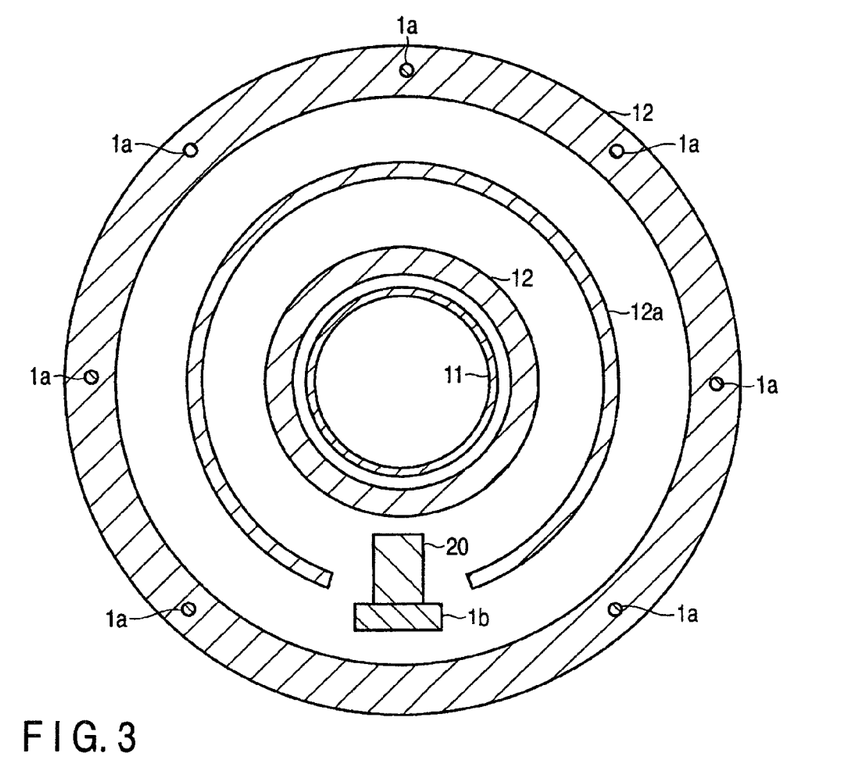
FIG. 3 is a diagram showing a cross section of the structure shown in FIG. 2 at a position taken along the line A-A.

FIG. 2 is a diagram showing a cross section of the structure of the first embodiment in a vicinity of the side ends of the static field magnet and the gradient coil shown in FIG. 1. Note that FIG. 2 shows a cross section taken along a vertical plane passing the center of the static field. FIG. 3 is a cross section at a position taken along the line A-A in FIG. 2. In FIGS. 2 and 3, identical parts to those shown in FIG. 1 are designated by the same reference symbols. Further, note that the static field magnet 1 and gradient coil 2 are illustrated only by their outer frame bodies.

Inside the gradient coil 2, there is placed a bore tube 11 which is omitted from the illustration of FIG. 1. The bore tube 11 has a hollow cylindrical shape and it serves to prevent the subject 200 placed in its internal space from being directly brought into contact with the gradient coil 2.

In the vicinity of the side ends of the static field magnet 1 and gradient coil 2, a sealing cover 12, fixation tools 13 and 14, an O-ring 15, an O-ring holder 16, an anti-vibration member 17, a support member 18, an anti-vibration member 19 and a support member 20 are provided.

The sealing cover 12 has a disk-like shape with a circular hole made at the center. The diameter of the center hole is slightly larger than the outer diameter of the bore tube 11. The bore tube 11 is put through the center hole. The sealing cover 12 is fixed with the fixation tools 13 and 14 to a fixation shaft 1a provided for the static field magnet 1 in the vicinity of the edge of the outer circumferential side thereof. Further, an arc-shaped projection 12a is formed on the sealing cover 12. The arc-shaped projection 12a is set to bump against the side end of the static field magnet 1.

On the edge of the sealing cover 12 which faces the above-described hole, a taper 12b which expands outwards is formed circumferentially. Between the taper 12b and the outer surface of the bore tube 11, the O-ring 15 is placed. The O-ring 15 is held by the O-ring holder 16 to bump against the taper 12b and bore tube 11. Further, in a gap between the sealing cover 12 and the outer surface of the bore tube 11, the anti-vibration member 17 is placed at an upper part of the bore tube 11.

The bore tube 11 is supported as the support member mounted underneath bumps against the projection 12c made on the sealing cover via the anti-vibration member 19.

The gradient coil 2 is fixed to the fixation shaft 1a provided for the static field magnet 1 via the support member 20 mounted to the side end thereof. The projection member 12a is formed so as not to interfere with the fixation shaft 1a.

It should be noted that the structure in the vicinity of the side ends of the static field magnet 1 and gradient coil 2 on an opposite side to that shown in FIG. 2 is symmetrical to that described above.

With the structure described above, there is created a hermetically sealed space 30 around the gradient coil 2 as it is surrounded by the static field magnet 1, bore tube 11 and sealing cover 12. The air in the sealed space 30 is discharged by a vacuum pump, which is not shown in the drawing, to create a vacuum in the sealed space 30, thereby making possible to help prevent the noise generated by the gradient coil 2 from being transmitted to the surroundings.

When the sealed space 30 is evacuated, the sealing cover 12 is pressurized towards the sealed space 30 by the pressure, that is, in the axial direction. Here, besides the fixation sections of the sealing cover 12 to the static field magnet 1, the sealing cover 12 bumps against the static field magnet 1 by the projection 12a as well, and thus the load of the sealing cover 12 in the axial direction can be received by the sealing cover 12 itself and the static field magnet 1. With this structure, the bore tube 11 need not receive the load of the sealing cover 12 in the axial direction, and accordingly there is no need to rigidly couple the bore tube 11 and sealing cover 12 together. Therefore, in the first embodiment, the sealing cover 12 is merely located close to the bore tube 11. As a result, it is possible to reduce the transmission of vibration from the sealing cover 12 to the bore tube 11 and further to reduce the thickness of the bore tube.

Note that it is preferable that the projection 12a should be provided at such a position that is as distant as possible from the fixation section, but it surely bumps against the static field magnet 1 in order to prevent deformation of the end portion of the sealing cover 12 on the bore tube 11 side due to air pressure. On the other hand, the section of the sealing cover 12 which receives air pressure without being supported by the static field magnet 1 is divided into two parts, a part closer to the center of the static field over the projection 12a, and a part far from the center. As the difference in area of receiving the air pressure between these two parts is smaller, the air pressure can be received more uniformly by the sealing cover 12 as a whole. Here, when supposing the distances of the respective sections of the sealing cover 12 from the center of the static field are set as $r_1$, $r_2$, $r_3$ and $r_4$, it is desirable that the values of $r_1$, $r_2$, $r_3$ and $r_4$ should be determined to be such values that the results of $2\pi r_2 - 2\pi r_1$ and $2\pi r_4 - 2\pi r_3$ are as close as possible.

Here, it should be noted that the removal of an error in positions of the side of the static field magnet 1 and the side end of the bore tube 11 with regard to each other is very difficult due to the errors in the manufacture of the static field magnet 1 and the bore tube 11. Conventionally, in order to fix the sealing cover to each of the side of the static field magnet 1 and the side end of the bore tube 11, whose relative positions to each other may vary, the above-described drawbacks are dealt with by absorbing the error in such relative positions through the deformation of the sealing cover. By contrast, according to the first embodiment, the bore tube 11 need not receive the load in the axial direction from the sealing cover 12. Therefore, the sealed space 30 can be maintained in a vacuum state with the above-described structure in which the bore tube 11 can be made to pass beyond the outer side surface of the static magnet 1 and the air-tightness is secured by the O-ring 15. Further, with this structure, even if the positions of the side of the static field magnet 1 and the side end of the bore tube 11 change relative to each other, only the bumping position of the sealing cover 12 to the bore tube 11 displaces, but it is still possible to maintain air-tightness. Therefore, the sealing cover 12 need not be deformed.

In the meantime, as a structure to support a gradient coil, a static field magnet support structure which supports the gradient coil by a static field magnet, and a floor support structure which supports the gradient coil by the floor are conventionally known. In the static field magnet support structure, the vibration is propagated from the gradient coil to the bore tube via solid bodies such as the static field magnet and sealing cover, In the floor support structure, the vibration propagated from the gradient coil to the bore tube via solid bodies is reduced, but the vibration caused by an eddy current generated in the static field magnet due to leaking magnetic field from the gradient coil is propagated directly to the bore tube via the sealing cover. Here, according to the first embodiment, despite the static field magnet support structure being employed, the propagation of the vibration from the static field magnet 1 and sealing cover 12 to the bore tube 11 via the sealing cover 12 can be reduced since the bore tube 11 and sealing cover 12 are rigidly coupled with each other. It should be noted that in this embodiment, the anti-vibration members 17 and 19 are provided between the bore tube 11 and sealing cover 12, and thus the propagation of the vibration to the bore tube 11 via the static field magnet 1 can be reduced even more reliably. Naturally, the first embodiment can be realized with the employment of the floor support structure. In such a case as well, the propagation of the vibration from the static field magnet 1 and sealing cover 12 to the bore tube 11 via the sealing cover 12 can be reduced.

Further, in order to fix the sealing cover to the side end of the bore tube as in the conventional techniques, it is necessary for the bore tube to have a sufficient thickness at least in its side end for receiving a fixing tool such as a screw. Here, in the first embodiment, the sealing member 12 is not fixed to the bore tube 11, and therefore the bore tube 11 can be made thinner than the conventional cases. Therefore, if the outer diameter of the bore tube is maintained constant, the inner diameter of the opening of the bore tube can be made larger in the first embodiment. In this manner, the sense of being oppressed which may be felt by the subject can be lightened.

Second Embodiment

Figure 4:
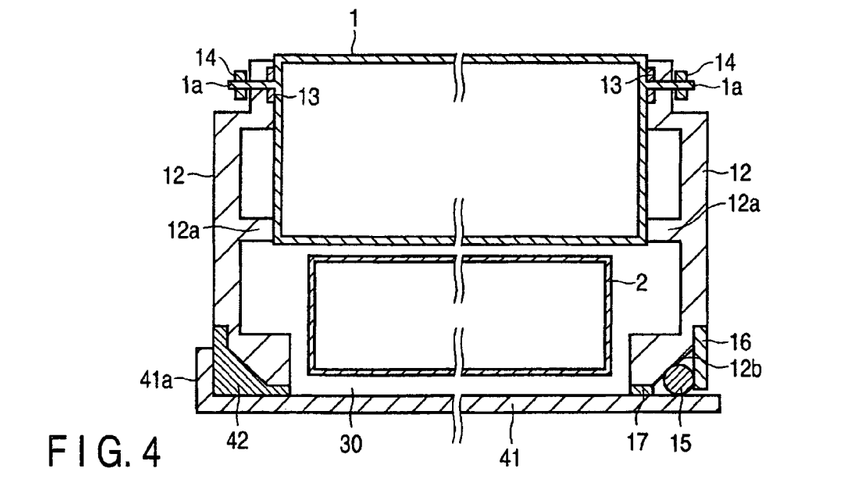
FIG. 4 is a diagram showing a cross section of the structure of the second embodiment in a vicinity of the side ends of the static field magnet and the gradient coil shown in FIG. 1.

FIG. 4 is a diagram showing a cross section of the structure of the second embodiment in a vicinity of the side ends of the static field magnet and the gradient coil shown in FIG. 1. Note that FIG. 4 shows a cross section taken along a vertical plane passing the center of the static field. In FIG. 4, identical parts to those shown in FIGS. 1 and 2 are designated by the same reference symbols. Note that the static field magnet 1 and gradient coil 2 are illustrated only by their outer frame bodies. Further, the cross section of each member is shown only by the part located above the center of the static field.

Inside the gradient coil 2, there is placed a bore tube 41 which is omitted from the illustration of FIG. 1. The bore tube 41 has a hollow cylindrical shape and it serves to prevent the subject 200 placed in its internal space from being directly brought into contact with the gradient coil 2.

In the vicinity of the side ends of the static field magnet 1 and gradient coil 2, a pair of sealing covers 12, a pair of fixation tools 13 and 14, an O-ring 15, an O-ring holder 16, an anti-vibration member 17 and an sealing anti-vibration member 42 are provided. It should be noted that a pair of support members 18, a pair of anti-vibration members 19 and a pair of support members 20 similar to those shown in FIG. 2 are arranged although they are omitted from FIG. 4.

The sealing anti-vibration member 42 has a ring-like shape and wound around an outer circumference of the bore tube 41 at one end. The cross sectional shape of the sealing anti-vibration member 42 is formed to fit with a gap between the sealing cover 1 and the bore tube 41, that is, a space where the O-ring 15, the O-ring holder 16 and the anti-vibration member are arranged on the other end. The sealing anti-vibration member 42 serves to hermetically seal the gap between the sealing cover 1 and the bore tube 41 to increase the degree of air-tightness of the sealed space 30, and also to reduce the propagation of the vibration from the sealing covers 12 to the bore tube 41.

It should be noted that the bore tube 41 has a flange 41a formed in its end portion on the side where the sealing anti-vibration member 42 is mounted. The flange 41a retains the sealing anti-vibration member 42 in the gap between the sealing cover 12 and the bore tube 41 while it is being pushed therein.

According to the structure of the second embodiment described above, the function of each of the O-ring 15 and the anti-vibration member 17 in one end of the bore tube 41 is achieved by the sealing anti-vibration member 42 on the other end of the bore tube 41. Further, the function of holding the sealing anti-vibration member 42 is achieved by the flange 41a. In the manner, the number of parts can be decreased as compared to that of the structure of the first embodiment, and therefore it is possible to reduce the production cost and simplify the assembly of the apparatus.

It should be noted that the assembly of the MRI apparatus includes the operation of inserting the bore tube to a cavity formed inside the gradient coil 2. Here, the bore tube 41 of the second embodiment has the flange 41a formed in only one end thereof, and therefore the flange 41a does not cause difficulty in the above-described insertion operation.

It should be noted that the examination room in which the gantry including the static field magnet 1 and the gradient coil 2 of the MRI apparatus 100 has in many cases a size which is minimum to install the gantry. In such cases, the opposite side of the gantry to where the bed 4 is located is set close to a wall of the examination room. With such an installation condition, it is difficult to create a space where the above-described insertion is carried out in the opposite side of the gantry to where the bed 4 is located. In order to avoid this, it is desirable that the side where the bed 4 is located should be on the left hand side of the illustration shown in FIG. 4.

Third Embodiment

Figure 5:
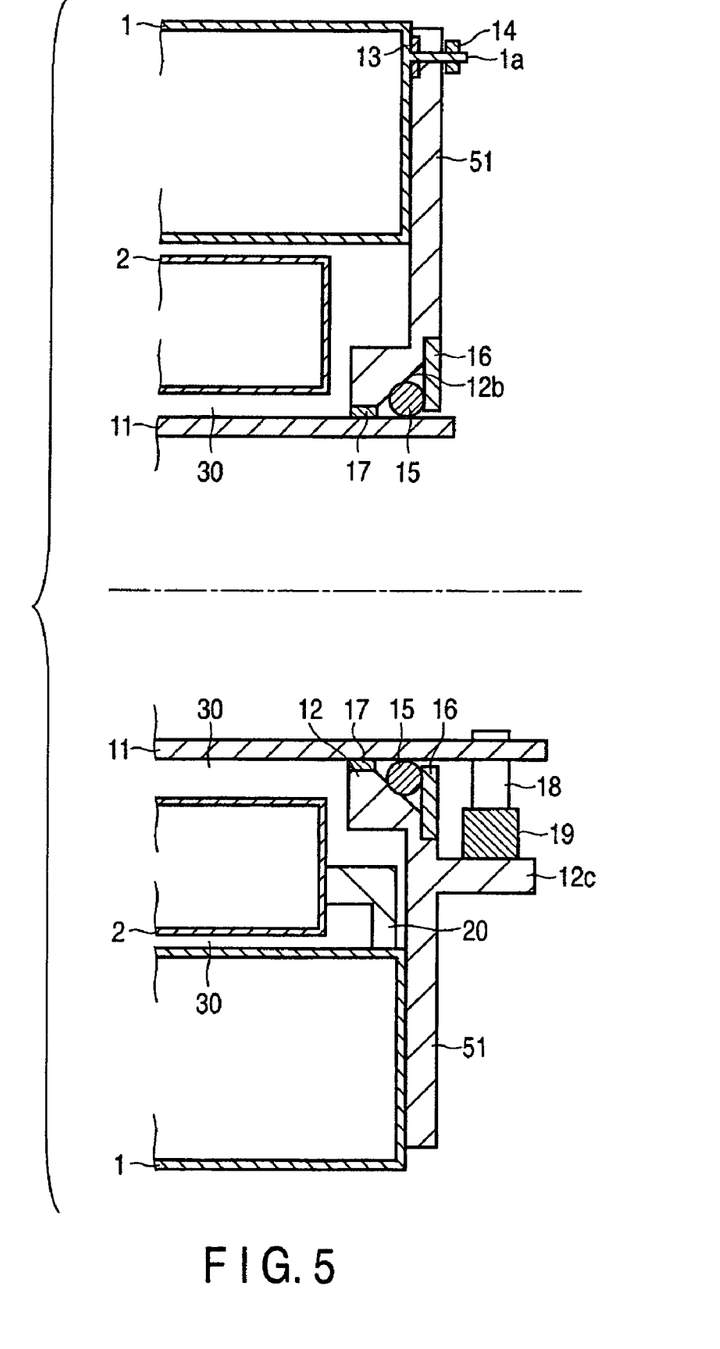
FIG. 5 is a diagram showing a cross section of the structure of the third embodiment in a vicinity of the side ends of the static field magnet and the gradient coil shown in FIG. 1.

FIG. 5 is a diagram showing a cross section of the structure of the third embodiment in a vicinity of the side ends of the static field magnet and the gradient coil. Note that FIG. 5 shows a cross section taken along a vertical plane passing the center of the static field. In FIG. 5, identical parts to those shown in FIGS. 1 and 2 are designated by the same reference symbols.

In the vicinity of the side ends of the static field magnet 1 and gradient coil 2, there are provided elements, namely, a bore tube 11, fixation tools 13 and 14, an O-ring 15, an O-ring holder 16, an anti-vibration member 17, a support member 18, an anti-vibration member 19, a support member 20 and a sealing cover 51, which are omitted from the illustration of FIG. 1. In other words, in the third embodiment, the sealing cover 12 in the first embodiment is replaced by the sealing cover 51.

The sealing cover 51 has a taper 12b formed at its one end as in the case of the sealing cover 12, but the other end of the cover is formed into a simple plate-like form, with no projection 12a formed therein. The sealing cover 51 is fixed to the static field magnet 1 while the plate-like portion of the cover is in contact with the greater part of the side end surface of the static field magnet 1.

With the structure of the third embodiment described above, even if the positions of the side of the static field magnet 1 and the side end of the bore tube 11 change relative to each other, only the bumping position of the sealing cover 51 to the bore tube 11 displaces, but it is still possible to maintain air-tightness. Therefore, the sealing cover 51 need not be deformed.

Further, the sealing cover 51 has a shape more simple than that of the sealing cover 12, and therefore the manufacture of the sealing cover 51 is easier.

It should be noted that the portion of the sealing cover 51 which is not brought into contact with the side end surface of the static field magnet 1 receives a higher air pressure as compared to the portion which is brought into contact with the side end surface of the static field magnet 1. In other words, the portion which receives the air pressure is deviated to the inner circumferential side of the sealing cover 51. As a result, the inner circumferential side of the sealing cover 51 is pressurized strongly towards the sealed space 30, and accordingly, the force to separate the outer circumferential side of the sealing cover 51 from the static field magnet 1 becomes larger. Therefore, in order to withstand such a force, it is necessary to form the fixation shaft 1a and the fixation tool 14 stronger as compared to those of the first embodiment.

These embodiments can be modified into various versions such as follows.

The sealing cover 12 or 51 may be made to directly bump against the outer circumferential surface of the bore tube 11.

The sealing cover 12 or 51 may be made to bump against the side end of the bore tube 11.

A different type of packing member may be used in place of the O-ring 15.

Figure 6:
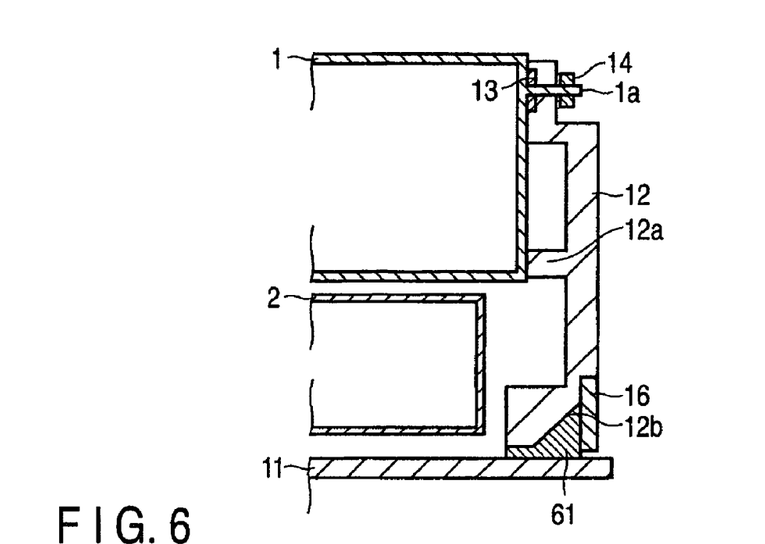
FIG. 6 is a diagram showing a cross section of the structure of a modified version in a vicinity of the side ends of the static field magnet and the gradient coil shown in FIG. 1.

In place of the O-ring 15 and the anti-vibration member 17, such a member which serves a packing function as well as an anti-vibration function, or a member in which the O-ring 15 and anti-vibration member 17 are integrated, such as the sealing anti-vibration member 61 shown in FIG. 6, may be provided.

Figure 7:
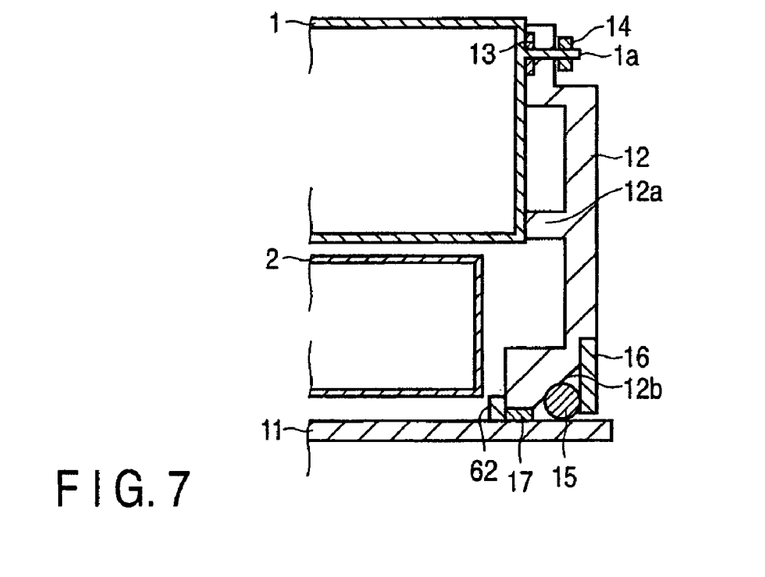
FIG. 7 is a diagram showing a cross section of the structure of a modified version in a vicinity of the side ends of the static field magnet and the gradient coil shown in FIG. 1.

Further, the end portion of the sealing cover 12 or 51 on the side close to the bore tube 11 or 41 may be pressurized by the air pressure and bent towards the gradient coil 2. In order to avoid this, for example, a stopper 62 may be mounted to the bore tube 11 or 41 as shown in FIG. 7 in order to prevent the deformation of the sealing cover 12 or 51 described above.

Figure 8:
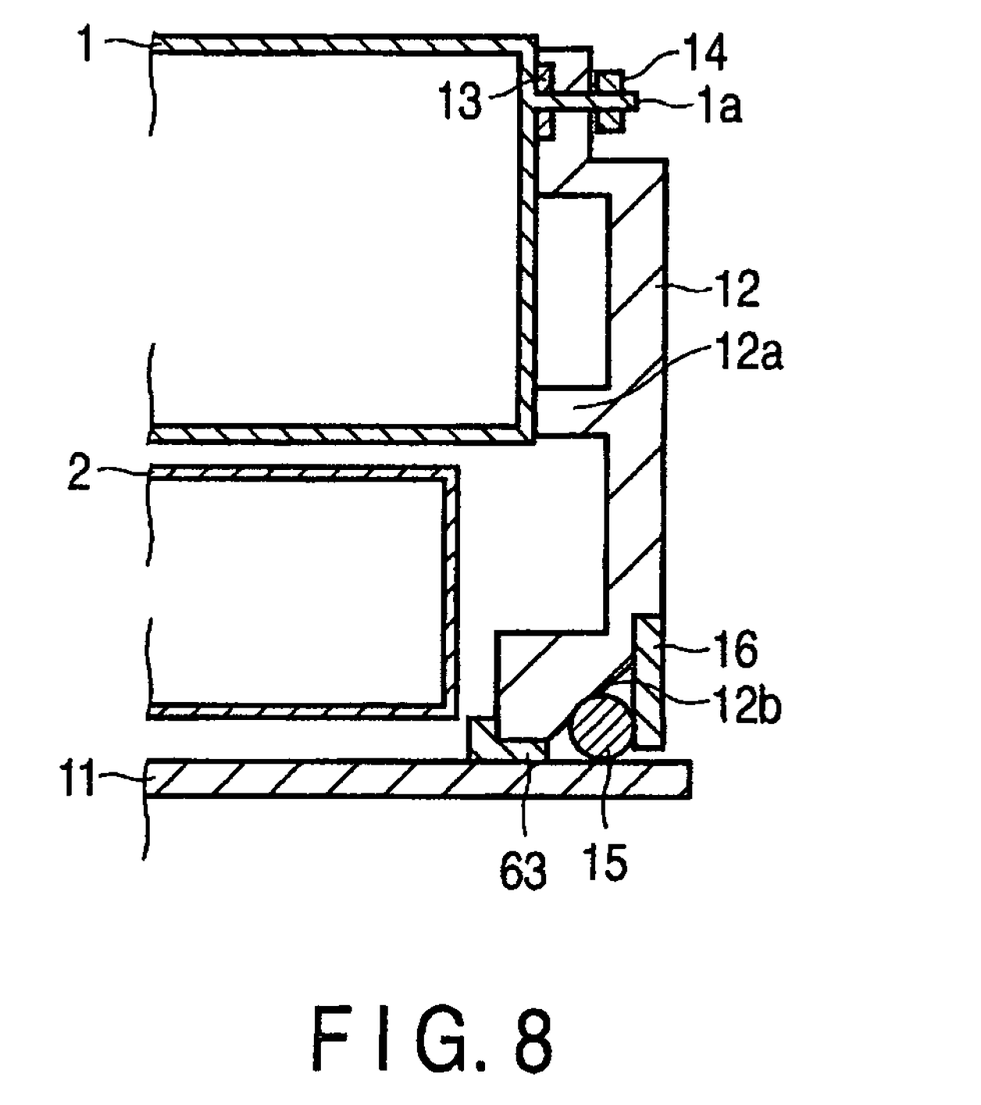
FIG. 8 is a diagram showing a cross section of the structure of a modified version in a vicinity of the side ends of the static field magnet and the gradient coil shown in FIG. 1.

Alternatively, a member which serves the function of the anti-vibration 17 as well as the function of the stopper 62, such as an anti-vibration stopper 63 shown in FIG. 8, may be provided for the bore tube 11 or 41.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a bore tube inside which an imaging space is formed to place a subject;
   a static field generating section which is placed outside the bore tube and generates a static field in the imaging space;
   a gradient field generating section which is placed between the bore tube and the static field generating section and generates a gradient field to superimpose on the static field;
   at least one sealing cover which is mounted to at least one side end of the static field generating section and which forms a vacuum space in a surrounding of the gradient field generating section together with the bore tube and the static field generating section,
   wherein the sealing cover is fixed by a fixation part thereof to the static field generating section and configured to direct an air pressure load caused by reduced air pressure in said vacuum space to be applied on the sealing cover at a part different from the fixation part and to be received by the static field generating section.

2. The magnetic resonance imaging apparatus according to claim 1, further comprising:
   at least one sealing part which is placed to be brought into contact with an outer side surface of the bore tube in a vicinity of at least one end of the bore tube, and hermetically sealing a gap between the bore tube and the sealing cover.

3. The magnetic resonance imaging apparatus according to claim 2, wherein the at least one sealing part reduces propagation of vibration between the bore tube and the sealing cover.

4. The magnetic resonance imaging apparatus according to claim 2, wherein two sealing parts are provided respectively in vicinities of both ends of the bore tube and one of the two sealing parts at each end reduces propagation of vibration between the bore tube and the sealing cover located thereat.

5. The magnetic resonance imaging apparatus according to claim 1, further comprising at least one anti-vibration member which reduces propagation of vibration between the bore tube and at least one sealing cover.

6. The magnetic resonance imaging apparatus according to claim 5, wherein the at least one anti-vibration member is fixed to the bore tube and has such a shape that it bumps against the sealing cover when the sealing cover moves towards the gradient field generating section.

7. The magnetic resonance imaging apparatus according to claim 6, further comprising a bump member fixed to the bore tube such that it bumps against the sealing cover when the sealing cover moves towards the gradient field generating section.

8. The magnetic resonance imaging apparatus according to claim 1, wherein a part of at least one sealing cover is located below the bore tube to support the bore tube.

9. A magnetic resonance imaging apparatus comprising:
   a hollow bore tube inside which an imaging space is formed to place a subject;
   a hollow static field generating section which is placed outside the bore tube and generates a static field in the imaging space;
   a hollow gradient field generating section which is placed between the bore tube and the static field generating section and generates a gradient field to superimpose on the static field; and
   at least one sealing cover including a cover portion which covers an opening between the static field generating section and the bore tube at a position distant from an end surface of the static field generating section, a fixation section fixed to the static field generating section and a bump section which is located distant from the fixation section and bumps against the end surface of the static field generating section, the sealing cover being mounted to at least one of side ends of the static field generating section and forming a sealed space in a surrounding of the gradient field generating section together with the bore tube and the static field generating section.

10. The magnetic resonance imaging apparatus according to claim 9, further comprising:
    at least one sealing part which is placed to be brought into contact with an outer side surface of the bore tube in a vicinity of at least one of both end sides of the bore tube, and hermetically sealing a gap between the bore tube and the sealing cover.

11. The magnetic resonance imaging apparatus according to claim 10, wherein the at least one sealing part reduces propagation of vibration between the bore tube and the sealing cover.

12. The magnetic resonance imaging apparatus according to claim 10, wherein two sealing parts are provided respectively in vicinities of both end sides of the bore tube and one of the two sealing parts reduces propagation of vibration between the bore tube and the pair of sealing covers.

13. The magnetic resonance imaging apparatus according to claim 9, further comprising at least one anti-vibration member which reduces propagation of vibration between the bore tube and at least one sealing cover.

14. The magnetic resonance imaging apparatus according to claim 13, wherein the at least one anti-vibration member is fixed to the bore tube and has such a shape that it bumps against the sealing cover when the sealing cover moves towards the gradient field generating section.

15. The magnetic resonance imaging apparatus according to claim 9, further comprising a bump member fixed to the bore tube such that it bumps against the sealing cover when the sealing cover moves towards the gradient field generating section.

16. The magnetic resonance imaging apparatus according to claim 9, wherein a part of at least one of the pair of sealing covers is located below the bore tube such as to support the bore tube.

17. A magnetic resonance imaging apparatus comprising:
    a bore tube inside which an imaging space is formed to place a subject;

a static field generating section which is placed outside the bore tube and generates a static field in the imaging space;

a gradient field generating section which is placed between the bore tube and the static field generating section and generates a gradient field to superimpose on the static field;

at least one sealing cover which is mounted to at least one side end of the static field generating section and which forms a sealed space in a surrounding of the gradient field generating section together with the bore tube and the static field generating section; and at least one sealing part disposed to be brought into contact with an outer side surface of the bore tube in a vicinity of at least one of both end sides of the bore tube, and hermetically sealing a gap between the bore tube and the sealing cover.

18. The magnetic resonance imaging apparatus according to claim 17, wherein the at least one sealing part reduces propagation of vibration between the bore tube and the sealing cover.

19. The magnetic resonance imaging apparatus according to claim 17, wherein two sealing parts are provided respectively in vicinities of both end sides of the bore tube and one of the two sealing parts reduces propagation of vibration between the bore tube and a pair of the sealing covers.

20. The magnetic resonance imaging apparatus according to claim 17, further comprising at least one anti-vibration member which reduces propagation of vibration between the bore tube and at least one of a pair of the sealing covers.

21. The magnetic resonance imaging apparatus according to claim 20, wherein the at least one anti-vibration member is fixed to the bore tube and has such a shape that it bumps against the sealing cover when the sealing cover moves towards the gradient field generating section.

22. The magnetic resonance imaging apparatus according to claim 17, further comprising a bump member fixed to the bore tube such that it bumps against the sealing cover when the sealing cover moves towards the gradient field generating section.

23. The magnetic resonance imaging apparatus according to claim 17, wherein a part of at least one pair of the sealing covers is located below the bore tube to support the bore tube.

24. The magnetic resonance imaging apparatus according to claim 1, wherein a sealing cover is mounted respectively to each side end of the static field generating section.

\* \* \* \* \*